United States Patent
Lee et al.

(10) Patent No.: US 9,281,082 B1
(45) Date of Patent: Mar. 8, 2016

(54) SEMICONDUCTOR MEMORY DEVICE INCLUDING REDUNDANCY CIRCUIT AND FUSE CIRCUIT

(71) Applicant: SK hynix Inc., Gyeonggi-do (KR)

(72) Inventors: Sung-Yub Lee, Gyeonggi-do (KR);
Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/699,707

(22) Filed: Apr. 29, 2015

(30) Foreign Application Priority Data

Dec. 19, 2014 (KR) .......................... 10-2014-0183878

(51) Int. Cl.
| | | |
|---|---|---|
| *G11C 17/00* | (2006.01) | |
| *G11C 29/00* | (2006.01) | |
| *G11C 17/16* | (2006.01) | |
| *G11C 17/18* | (2006.01) | |
| *G11C 29/04* | (2006.01) | |
| G11C 29/44 | (2006.01) | |

(52) U.S. Cl.
CPC ............... *G11C 29/78* (2013.01); *G11C 17/16* (2013.01); *G11C 17/18* (2013.01); *G11C 29/04* (2013.01); *G11C 29/765* (2013.01); *G11C 29/785* (2013.01); *G11C 29/808* (2013.01); *G11C 2029/4402* (2013.01)

(58) Field of Classification Search
CPC .... G11C 29/765; G11C 29/04; G11C 29/808; G11C 29/785; G11C 2029/4402
USPC ........... 365/96, 185.09, 189.05, 189.09, 200, 365/225.7
See application file for complete search history.

(56) References Cited

U.S. PATENT DOCUMENTS

| | | | | |
|---|---|---|---|---|
| 9,142,325 B2* | 9/2015 | Lee | ....................... | G11C 29/765 |
| 2015/0003141 A1* | 1/2015 | Son | ....................... | G11C 29/785 365/96 |
| 2015/0043288 A1* | 2/2015 | Kim | ....................... | G11C 17/14 365/189.05 |

FOREIGN PATENT DOCUMENTS

KR    1020140085222    7/2014

* cited by examiner

*Primary Examiner* — Gene Auduong
(74) *Attorney, Agent, or Firm* — IP & T Group LLP

(57) ABSTRACT

Disclosed herein is a fuse circuit including a storage unit capable of storing defective address information corresponding to mat information when a boot-up operation is performed, a driving control unit coupled between the storage unit and a first power source terminal, and capable of forming a current path between the storage unit and the first power source terminal in response to the defective address information transferred through a first data line and the mat information transferred through a second data line while blocking the current path between the storage unit and the first power source terminal when a normal operation is performed, and an output unit capable of outputting the defective address information stored in the storage unit when the normal operation is performed.

17 Claims, 4 Drawing Sheets

US 9,281,082 B1

SEMICONDUCTOR MEMORY DEVICE INCLUDING REDUNDANCY CIRCUIT AND FUSE CIRCUIT

CROSS-REFERENCE TO RELATED APPLICATION(S)

The present application claims priority of Korean Patent Application No. 10-2014-0183878 filed on Dec. 19, 2014, which is incorporated herein by reference in its entirety.

BACKGROUND

1. Field

Exemplary embodiments of the present invention relate to a semiconductor design technology, and more particularly, to a semiconductor memory device including a redundancy circuit for outputting repair address information when a repair operation is performed, and a fuse circuit.

2. Description of the Related Art

As high density integration for semiconductor memory devices is advanced, the number of memory cells and signal lines included in a single semiconductor memory device is increased. Accordingly, the critical dimensions of internal circuits becomes narrower and the size of the memory cells is reduced because the semiconductor memory devices are integrated within a limited space. If even one memory cell in a semiconductor memory device has a defect, the entire device has to be discarded because it does not perform as required. As process technology for semiconductor memory devices develops, defects occur stochastically in only a small number of memory cells. To discard the entire semiconductor memory device due to a small number of defective memory cells is very inefficient in terms of the yield.

Accordingly, redundancy memory cells are included in a semiconductor memory device along with normal memory cells. When a defect occurs in a normal memory cell, the normal memory cell is replaced with a redundancy memory cell. A redundancy circuit may indicate that a normal memory cell has been replaced with a redundancy memory cell due to a defect in the normal memory cell. The redundancy circuit includes a plurality of fuses in which defective memory cell address information is programmed.

An array e-fuse (ARE) is a grouping of electrical fuses in an array. The redundancy circuit performs a boot-up operation for sequentially reading defective address information programmed into the ARE and storing the read defective address information in a latch.

FIG. 1 is a block diagram illustrating a known redundancy circuits included in a semiconductor memory device.

Referring to FIG. 1, the redundancy circuit includes a fuse unit 110 and an address comparison unit 120. The fuse unit 110 includes a fuse array 111 and a repair address output unit 113.

The fuse array 111 includes a plurality of fuses (not shown) and programs defective address information on addresses to be repaired, through a rupture operation. In this case, the fuse array 111 may be implemented with an ARE.

The repair address output unit 113 receives a reset signal RST, a mat selection signal XMATYF, and fuse data FDATA from the fuse array 111. The fuse data FDATA corresponds to the defective address information programmed into the fuse array 111.

When a boot-up operation is performed, the repair address output unit 113 sequentially receives the mat selection signal XMATYF and the fuse data FDATA corresponding to the mat selection signal XMATYF from the fuse array 111, and stores them. Thereafter, when a normal operation is performed, the repair address output unit 113 outputs data stored in response to an activated mat selection signal XMATYF, as a repair address R_ADD.

The reset signal RST is a signal for resetting the repair address R_ADD and is activated in a precharge mode. The mat selection signal XMATYF denotes a cell mat that is activated in an active operation section of a bank on which read and write operations are to be performed in a semiconductor memory device.

The address comparison unit 120 receives a normal address N_ADD from outside and the repair address R_ADD from the fuse unit 110 and outputs a redundancy enable signal RED_EN. The address comparison unit 120 compares the repair address R_ADD with the normal address N_ADD. When the repair address R_ADD is identical to the normal address N_ADD, the address comparison unit 120 activates the redundancy enable signal RED_EN for performing a repair operation on a corresponding mat.

The semiconductor memory device drives a redundancy memory cell in response to the redundancy enable signal RED_EN.

FIG. 2 is a detailed circuit diagram illustrating the repair address output unit 113 of FIG. 1.

Referring to FIG. 2, the repair address output unit 113 includes a first latch unit 2100 and a second latch unit 2200 for respectively receiving first and second mat selection signals XMATYF1 and XMATYF2.

The first and second latch units 2100 and 2200 may be implemented with a cross-coupled latch (CCL).

The first latch unit 2100 includes first to fourth storage nodes SN1 to SN4, first to fourth transistor pairs 211, 212, 213, and 214, and a driving control unit 220.

The second latch unit 2200 has the same configuration as the first latch unit 2100. The configuration and operation of the first latch unit 2100 are described as an example.

Each of the first to fourth transistor pairs 211 to 214 includes a corresponding one of PMOS transistors 211A to 214A and a corresponding one of NMOS transistors 211B to 214B, which are coupled in series through a corresponding one of the first to fourth storage nodes SN1 to SN4. Each of the storage nodes SN1 to SN4 is connected to a gate of an NMOS transistor of a transistor pair in a previous stage and a gate of a PMOS transistor of a transistor pair in a next stage. For example, the second storage node SN2 is connected to the gate of the NMOS transistor 211B of the first transistor pair 211 and the gate of the PMOS transistor 213A of the third transistor pair 213.

The driving control unit 220 includes four NMOS transistors 221 to 224. The NMOS transistors 221 to 224 are turned on in response to the first mat selection signal XMATYF1 activated to a "high" level. The driving control unit 220 transfers the fuse data FDATA received through a first data line DL1, to the first and third storage nodes SN1 and SN3, and transfers inverted fuse data FDATAB received through a second data line DL2, to the second and fourth storage nodes SN2 and SN4. Accordingly, the first and third storage nodes SN1 and SN3 and the second and fourth storage nodes SN2 and SN4 have opposite logic levels.

An operation of the first latch unit 2100 is described below.

The first to fourth storage nodes SN1 to SN4 are initially set to respective "low, high, low, and high" levels through a reset operation.

When the first mat selection signal XMATYF1 is activated to a "high" level and the fuse data FDATA of a "high" level is applied, the driving control unit 220 is activated in response to the first mat selection signal XMATYF1 of a "high" level.

Accordingly, a current path is formed between the NMOS transistors 221 to 224 and the first and second data lines DL1 and DL2.

The inverted fuse data FDATAB of a "low" level is applied to the gates of the NMOS transistors 211B and 213B of the first and third transistor pairs 211 and 213 through the second data line DU, and the fuse data FDATA of a "high" level is applied to the gates of the NMOS transistors 212B and 214B of the second and fourth transistor pairs 212 and 214 through the first data line DL1. Accordingly, the first and third storage nodes SN1 and SN3 change from a "low" level to a "high" level, and the second and fourth storage to nodes SN2 and SN4 change from a "high" level to a "low" level. The first to fourth storage nodes SN1 to SN4 change to "high, low, high, and low" levels from the initially set "low, high, low, and high" levels, respectively.

In contrast, when the first mat selection signal XMATYF1 is activated to a "high" level and the fuse data FDATA of a "low" level is applied, the driving control unit 220 is activated in response to the first mat selection signal XMATYF1 of a "high" level. Accordingly, the current path is formed between the NMOS transistors 221 to 224 and the first and second data lines DL1 and DL2.

The inverted fuse data FDATAB of a "high" level is applied to the gates of the NMOS transistors 211B and 213B of the first and third transistor pairs 211 and 213 through the second data line DL2, and the fuse data FDATA of a "low" level is applied to the gates of the NMOS transistors 212B and 214B of the second and fourth transistor pairs 212 and 214 through the first data fine DL1. Accordingly, the first to fourth storage nodes SN1 to SN4 maintain the initially set "low, high, low, and high" levels regardless of the current path formed between the NMOS transistors 221 to 224 and the first and second data lines DL1 and DL2.

When a normal operation is performed, the first and second latch units 2100 and 2200 output data latched at an output node OUT through the first data line DL1 in response to the first mat selection signal XMATYF1 or the second mat selection signal XMATYF2 that is activated in response to an active command.

As a time interval tRP for which active and precharge commands are received is shortened, however, an activation section of the first mat selection signal XMATYF1 overlaps with that of the second mat selection signal XMATYF2 since the second mat selection signal XMATYF2 is activated when the activated first mat selection signal XMATYF1 has not been reset. In this case, the first latch unit 2100 and the second latch unit 2200 receive the first mat selection signal XMATYF1 and the second mat selection signal XMATYF2 at the same time. Accordingly, the driving control units 220 and 240 of the first latch unit 2100 and the second latch unit 2200 are simultaneously driven. When the driving control units 220 and 240 of the first latch unit 2100 and the second latch unit 2200 are driven at the same time, a current path between the first latch unit 2100 and the first and second data lines DL1 and DL2 and a current path between the second latch unit 2200 and the first and second data lines DL1 and DL2 are formed at the same time.

First and third storage nodes SN1 and SN3 of the second latch unit 2200 receive voltage levels of the first and third storage nodes SN1 and SN3 of the first latch unit 2100 through the first data line DL1. The first and third storage nodes SN1 and SN3 of the second latch unit 2200 change in response to the voltage of the first latch unit 2100 received through the first data line DL1. Accordingly, the data latched in the second latch unit 2200 during the boot-up operation changes during the normal operation. Thereafter, when the second mat selection signal XMATYF2 is activated, the second latch unit 2200 outputs the data changed during the normal operation, not the data latched during the boot-up operation.

Accordingly, the repair address output unit 113 outputs the data changed during the normal operation, as the repair address R_ADD. As described above, the semiconductor memory device determines whether the normal address N_ADD corresponds to a defective memory cell by comparing the repair address R_ADD received from the repair address output unit 113, with the normal address N_ADD received from the outside (e.g. an external device or host). However, the known redundancy circuit of the semiconductor memory device erroneously determines whether the normal address corresponds to the defective memory cell since it outputs the changed data as the repair address, not the latched data. Accordingly, the reliability in the repair operation of the semiconductor memory device is reduced.

SUMMARY

Various embodiments are directed to a redundancy circuit and a fuse circuit, capable of improving the reliability of a repair operation of a semiconductor memory device by blocking a current path between a latch unit and a data line during a normal operation so that data latched during a boot-up operation are not changed during the normal operation.

In an embodiment, a fuse circuit may include a storage unit capable of storing defective address information corresponding to mat information when a boot-up operation is performed, a driving control unit coupled between the storage unit and a first power source terminal, capable of forming a current path between the storage unit and the first power source terminal in response to the defective address information transferred through a first data line and the mat information transferred through a second data line while blocking the current path between the storage unit and the first power source terminal when a normal operation is performed, and an output unit capable of outputting the defective address information stored in the storage unit when the normal operation is performed.

The storage unit may include first to fourth storage nodes and first to fourth transistor pairs each including a PMOS transistor and an NMOS transistor that are coupled in series through a corresponding one of the first to fourth storage nodes.

Each of the first to fourth storage nodes may be coupled to a gate of an NMOS transistor of a transistor pair in a previous stage and a gate of a PMOS transistor of a transistor pair in a next stage.

The driving control unit may include first and second input transistors coupled to the second and fourth storage nodes, respectively, and driven in response to the defective address information, and a third input transistor coupled between the first and second input transistors and the first power source terminal, and driven in response to the mat information.

The output unit may include a first output transistor driven in response to a voltage level of the third storage node when the normal operation is performed and a second output transistor driven in response to the mat information when the normal operation is performed.

The storage unit may include a cross-coupled latch.

The first power source may include a ground power source.

In an embodiment, a redundancy circuit of a semiconductor memory device may include a fuse array capable of sequentially outputting defective address information through a first data line when a boot-up operation is performed, a repair address output unit capable of storing the defective address information received through the first data line when the boot-up operation is performed, and outputting defective address information to an output line that is different from the first data line, in response to mat information when a normal operation is performed, and an address comparison unit capable of comparing the defective address information output through the output line with a normal address and generating a redundancy activation signal.

The repair address output unit may include a latch unit capable of latching the defective address information corresponding to the mat information, and an output unit capable of outputting the defective address information latched in the latch unit when the normal operation is performed.

The latch unit may include a storage unit capable of storing the defective address information corresponding to the mat information when the boot-up operation is performed, and a driving control unit coupled between the storage unit and a first power source terminal, capable of forming a current path between the storage unit and the first power source terminal in response to the defective address information transferred through the first data line and the mat information transferred through a second data line while blocking the current path between the storage unit and the first power source terminal when the normal operation is performed.

The storage unit may include a cross-coupled latch.

The storage unit may include first to fourth storage nodes and first to fourth transistor pairs, each including a PMOS transistor and an NMOS transistor, that are coupled in series through a corresponding one of the first to fourth storage nodes.

Each of the first to fourth storage nodes may be coupled to the gate of the NMOS transistor of a transistor pair in a previous stage and the gate of the PMOS transistor of a transistor pair in a next stage.

The driving control unit may include first and second input transistors coupled to the second and fourth storage nodes, respectively, and driven in response to the defective address information, and a third input transistor coupled between the first and second input transistors and the first power source terminal, and driven in response to the mat information.

The first power source may include a ground power source.

The output unit may include a first output transistor driven in response to a voltage level of the third storage node when the normal operation is performed, and a second output transistor driven in response to the mat information when the normal operation is performed.

The first and second output transistors may be coupled between the output line and the first power source terminal.

DETAILED DESCRIPTION

Figure 1:
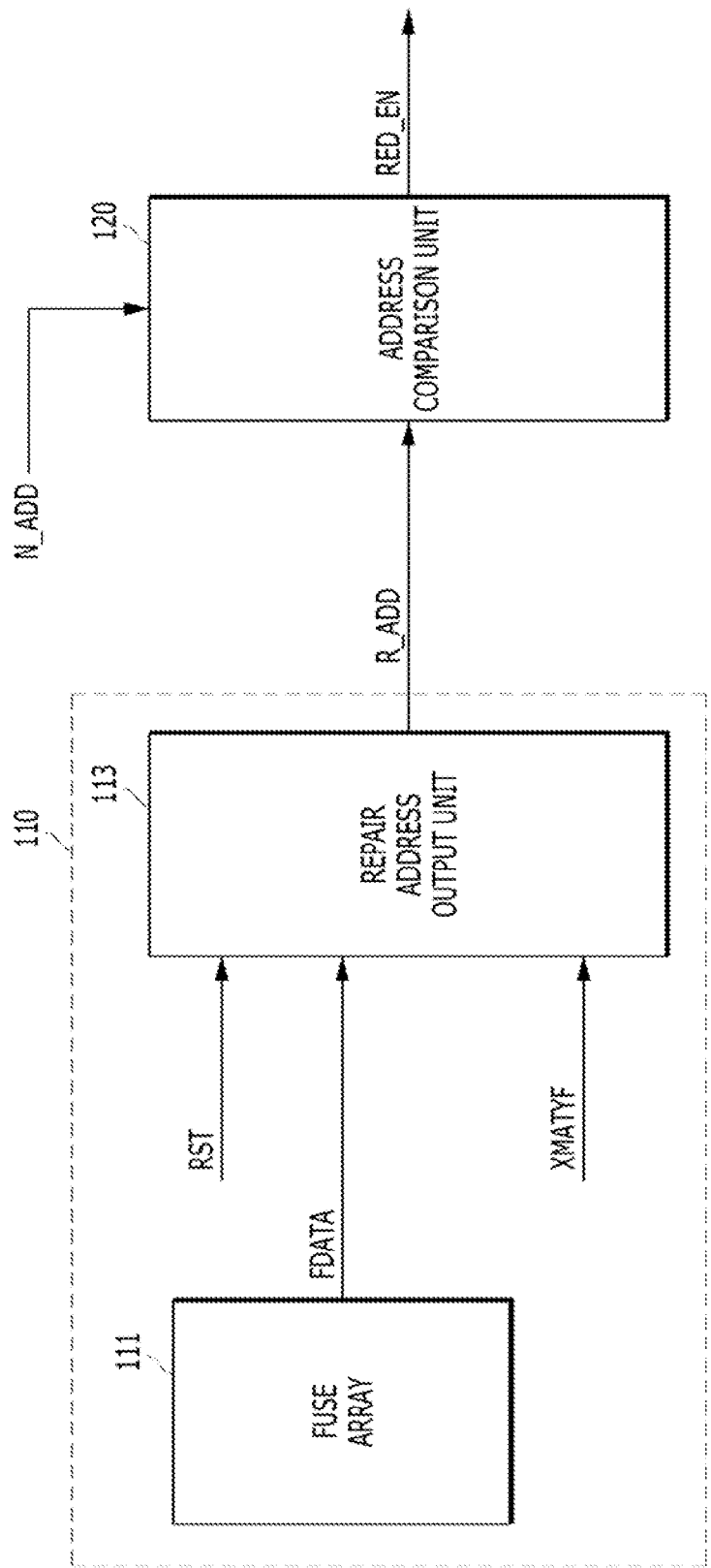
FIG. 1 is a block diagram illustrating a known redundancy circuit included in a semiconductor memory device.
Figure 2:
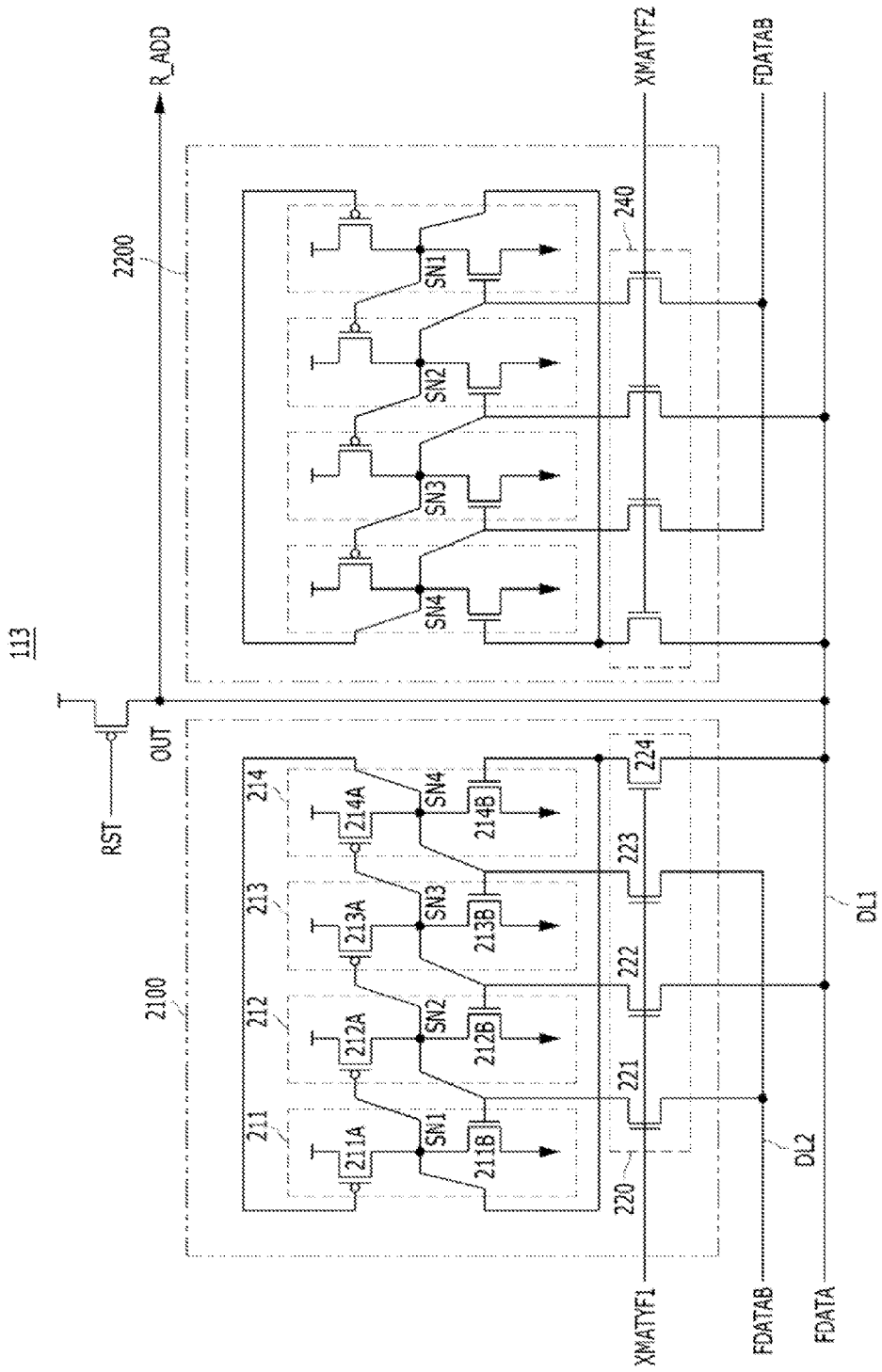
FIG. 2 is a detailed circuit diagram illustrating a repair address output unit of FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
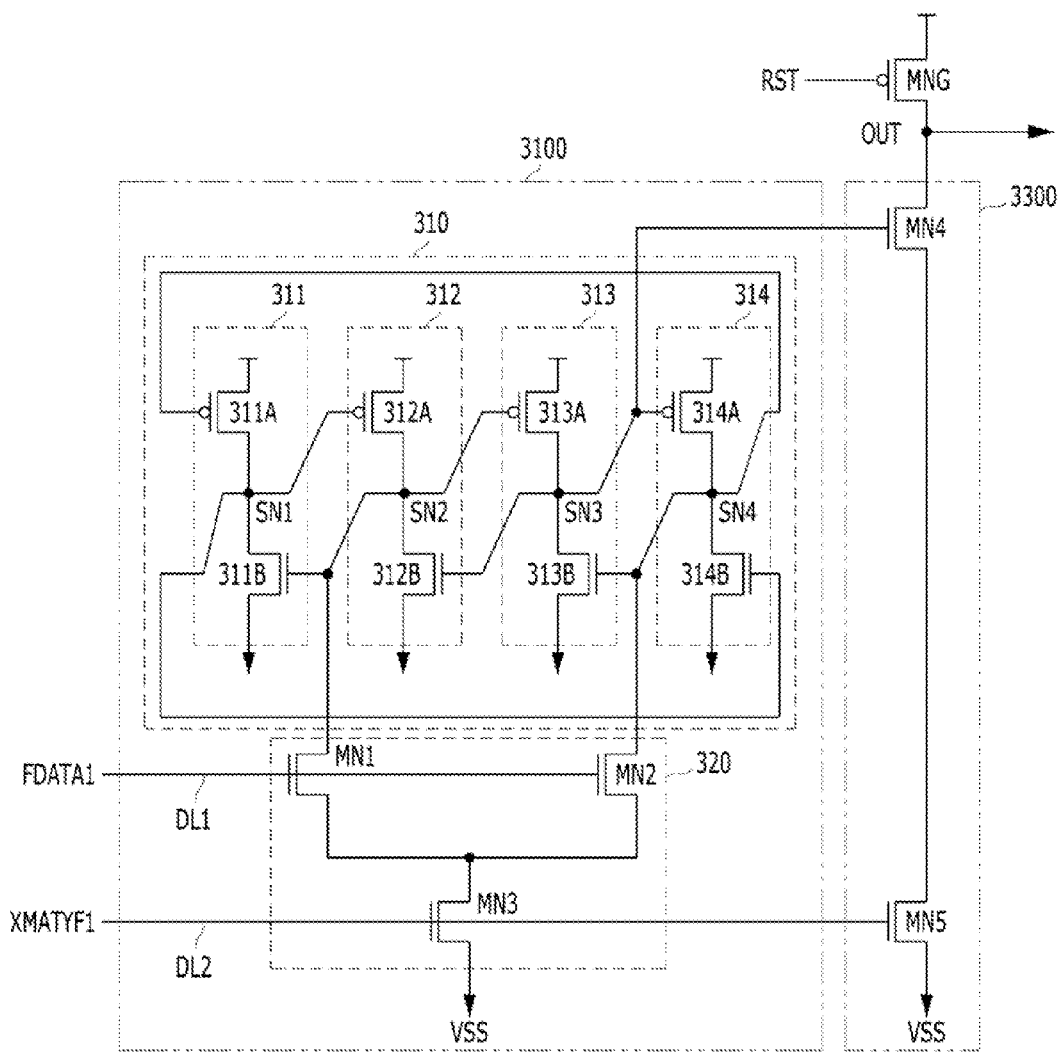
FIG. 3 is a detailed circuit diagram illustrating a repair address output unit in accordance with an embodiment of the present invention.

FIG. 3 is a detailed circuit diagram illustrating a repair address output unit in accordance with an embodiment of the present invention.

Referring to FIG. 3, the repair address output unit may include a latch unit 3100 and an output unit 3300. The latch unit 3100 may include a storage unit 310 and a driving control unit 320.

The driving control unit 320 may include first to third NMOS transistors MN1 to MN3.

Fuse data FDATA1 may be applied to gates of the first NMOS transistor MN1 and the second NMOS transistor MN2 through a first data line DL1. The first NMOS transistor MN1 and the second NMOS transistor MN2 are connected between the storage unit 310 and the third NMOS transistor MN3. The first NMOS transistor MN1 and the second NMOS transistor MN2 may form a current path between the storage unit 310 and the third NMOS transistor MN3 in response to the fuse data FDATA1.

A mat selection signal XMATYF1 may be applied to a gate of the third NMOS transistor MN3 through a second data line DL2. The third NMOS transistor MN3 is connected between the first and second NMOS transistors MN1 and MN2 and a ground power source (VSS) terminal. The third NMOS transistor MN3 may form a current path between the first and second NMOS transistors MN1 and MN2 and the ground power source (VSS) terminal in response to the mat selection signal XMATYF1.

The storage unit 310 may include first to fourth storage nodes SN1 to SN4 and first to fourth transistor pairs 311 to 314. Each of the first to fourth transistor pairs 311 to 314 may include a corresponding one of PMOS transistors 311A to 314A and a corresponding one of NMOS transistors 311B to 314B, which are connected in series through a corresponding one of the first to fourth storage nodes SN1 to SN4. Each of the first to fourth storage nodes SN1 to SN4 may be connected to a gate of an NMOS transistor of a transistor pair in a previous stage and a gate of a PMOS transistor of a transistor pair in a next stage. For example, the second storage node SN2 may be connected to the gate of the NMOS transistor 311B of the transistor pair 311 and the gate of the PMOS transistor 313A of the transistor pair 313. The second and fourth storage nodes SN2 and SN4 may be connected to the first and second NMOS transistors MN1 and MN2 of the driving control unit 320, respectively.

The output unit 3300 may include a fourth NMOS transistor MN4 driven in response to a voltage level of the third storage node SN3 and a fifth NMOS transistor MN5 driven in response to the mat selection signal XMATYF1. The fourth NMOS transistor MN4 may be connected between the fifth NMOS transistor MN5 and an output node OUT. The fifth NMOS transistor MN5 may be connected between the fourth NMOS transistor MN4 and the ground power source (VSS) terminal.

The output unit 3300 may be activated when the voltage level of the third storage node SN3 is a "high" level and the mat selection signal XMATYF1 is activated to a "high" level. That is, the output unit 3300 may form a current path between the fourth and fifth NMOS transistor MN4 and MN5 and the output node OUT.

An operation of the repair address output unit is described below.

<Boot-Up Operation>

First, when the boot-up operation is performed, the fuse data FDATA1 may be applied to the gates of the first and second NMOS transistors MN1 and MN2 of the driving control unit 320 through the first data line DL1. The mat selection signal XMATYF1 may be applied to the gate of the third NMOS transistor MN3 of the driving control unit 320 through the second data line DL2.

When an operation is initially performed, the first to fourth storage nodes SN1 to SN4 of the first to fourth transistor pairs 311 to 314 may be initially set to "low, high, low, and high" levels, respectively.

When the mat selection signal XMATYF1 is activated to a "high" level and the fuse data FDATA1 of a "high" level is received, the first to third NMOS transistors MN1 to MN3 may be activated in response to the fuse data FDATA1 and the mat selection signal XMATYF1 received through the first and second data lines DL1 and DL2, respectively. That is, a current path may be formed between the storage unit 310 and the driving control unit 320. Accordingly, the second and fourth storage nodes SN2 and SN4 of the storage unit 310 may change from a "high" level to a "low" level. Furthermore, the first and third storage nodes SN1 and SN3 may change from a "low" level to a "high" level.

That is, when the fuse data FDATA1 of a "high" level is received through the first data line DL1, the first to fourth storage nodes SN1 to SN4 may change from the initially set "low, high, low, and high" levels to "high, low, high, and low" levels, respectively.

In contrast, when the mat selection signal XMATYF1 is activated to a "high" level and the fuse data FDATA1 of a "low" level is received, the first and second NMOS transistors MN1 and MN2 are deactivated in response to the fuse data FDATA1 of a "low" level received through the first data line DL1. The third NMOS transistor MN3 may be activated in response to the mat selection signal XMATYF1 of a "high" level received through the second data line DL2. However, the current path may not to be formed between the storage unit 310 and the driving control unit 320 since the first and second NMOS transistors MN1 and MN2 are deactivated although the third NMOS transistor MN3 is activated. Accordingly, the second and fourth storage nodes SN2 and SN4 of the storage unit 310 may maintain the initially set "low, high, low, and high" levels.

<Normal Operation>

When the normal operation is performed, the repair address output unit in accordance with the embodiment of the present invention may block the current path between the storage unit 310 and the driving control unit 320 in response to the first data line DL1 fixed to a "low" level. Meanwhile, the fifth NMOS transistor MN5 of the output unit 3300 may be activated in response to the mat selection signal XMATYF1 activated to a "high" level. The fourth NMOS transistor MN4 may be driven in response to the level of the third storage node SN3.

The repair address output unit may include a reset unit MN6 for resetting a level of the output node OUT to a "high" level in response to a reset signal RST.

For example, during the boot-up operation, when the fuse data FDATA1 has a "high" level and thus "high, low, high, and low" levels are stored in the storage unit 310, the fourth NMOS transistor MN4 of the output unit 3300 may be activated in response to the "high" level of the third storage node SN3. Accordingly, a "low" level may be output from the output node OUT to outside as the fourth and fifth NMOS transistors MN4 and MN5 of the output unit 3300 are activated.

In contrast, during the boot-up operation, when the fuse data FDATA1 has a "low" level and thus "low, high, low, and high" levels are stored in the storage unit 310, a floating value may be output from the output node OUT to the outside since the fourth NMOS transistor MN4 of the output unit 3300 is deactivated in response to the "low" level of the third storage node SN3. That is, the output node OUT may maintain an initially set "high" level.

When the boot-up operation is performed, the repair address output unit in accordance with the embodiment of the present invention may latch the fuse data FDATA1 corresponding to the mat selection signal XMATFY1. In contrast, the repair address output unit may block the current path between the storage unit 310 and the driving control unit 320 since the first data line DL1 is fixed to the "low" level when the normal operation is performed.

Figure 4:
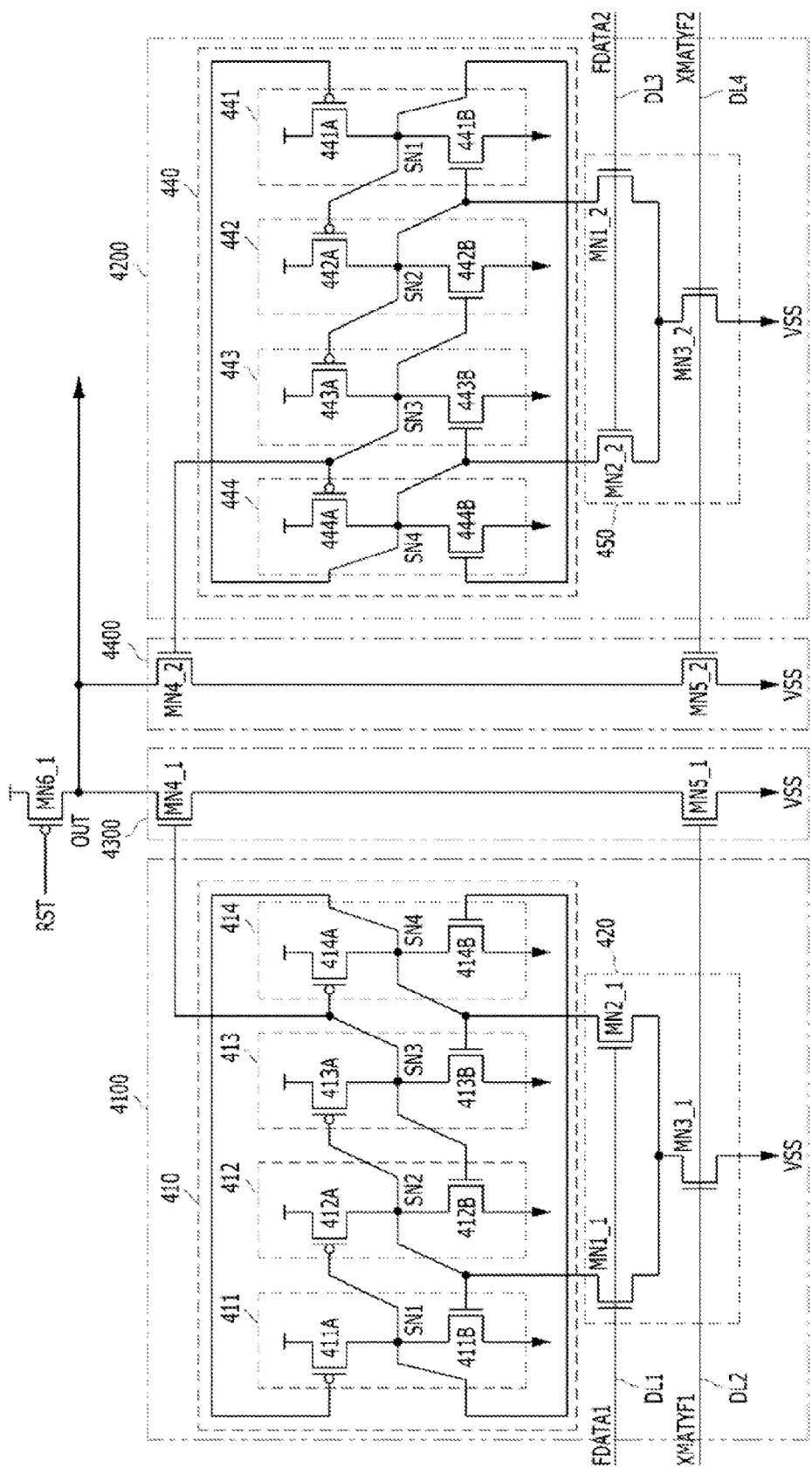
FIG. 4 is a detailed circuit diagram illustrating an operation of the repair address output unit of FIG. 3.

FIG. 4 is a detailed circuit diagram illustrating an operation of the repair address output unit of FIG. 3. In particular, FIG. 4 illustrates the operation of the repair address output unit when pieces of mat information overlap with each other, e.g., an activation section of a first mat selection signal XMATYF1 overlaps with that of a second mat selection signal XMATYF2.

The repair address output unit for receiving the first and second mat selection signals XMATYF1 and XMATYF2 is described below with reference to FIG. 4.

Referring to FIG. 4, the repair address output unit may include first and second latch units 4100 and 4200 and first and second output units 4300 and 4400.

The first latch unit 4100 may include a first storage unit 410 and a first driving control unit 420. The second latch unit 4200 may include a second storage unit 440 and a second driving control unit 450.

A description of the configuration of the repair address output unit illustrated in FIG. 4 may be the same as that of FIG. 3.

An operation of the repair address output unit is described below.

<Boot-Up Operation>

First, when the boot-up operation is performed, the first latch unit 4100 and the second latch unit 4200 may sequentially receive the first and second mat selection signals XMATYF1 and XMATYF2 through second data lines DL2 and fourth data lines DL4, and first and second fuse data FDATA1 and FDATA2, respectively corresponding to the first and second mat selection signals XMATYF1 and XMATYF2 through first data lines DL1 and third data lines DL3.

For example, it is assumed that the first fuse data FDATA1 has a "high" level and the second fuse data FDATA2 has a "low" level.

A first NMOS transistor MN1_1 and a second NMOS transistor MN2_1 of the first driving control unit 420 may be activated in response to the first fuse data FDATA1 of a "high" level received through the first data line DL1. The third NMOS transistor MN3_1 of the first driving control unit 420 may be activated in response to the first mat selection signal XMATYF1 of a "high" level received through the second data line DL2. Accordingly, a current path is formed between the first storage unit 410 and the first driving control unit 420, and thus second and fourth storage nodes SN2 and SN4 of the first storage unit 410 may change from a "low" level to a "high" level. Accordingly, first and third storage nodes SN1 and SN3 may change from a "high" level to a "low" level. The first to fourth storage nodes SN1 to SN4 of the first storage unit 410 may change from initially set "low, high, low, and high" levels to "high, low, high, and low" levels, respectively.

The first NMOS transistor MN1_2 and second NMOS transistor MN2_2 of the second driving control unit 450 are deactivated in response to the second fuse data FDATA2 of a "low" level received through the third data line DL3. The third NMOS transistor MN3_2 of the second driving control unit 450 may be activated in response to the second mat selection signal XMATYF2 of a "high" level received through the fourth data line DL4. Accordingly, a current path may not be formed between the second storage unit 440 and the second driving control unit 450 since the first and second NMOS transistors MN1_2 and MN2_2 are deactivated. As a result, first to fourth storage nodes SN1 to SN4 of the second storage unit 440 may maintain the initially set "low, high, low, and high" levels.

<Normal Operation>

When the normal operation is performed, the repair address output unit may output latched data in response to the first mat selection signal XMATYF1 or the second mat selection signal XMATYF2.

The repair address output unit may include a reset unit MN6_1 for resetting a level of an output node OUT to a "high" level in response to a reset signal RST.

For example, the third NMOS transistor MN3_1 of the first driving control unit 420 and the fifth NMOS transistor MN5_1 of the first output unit 4300 may be activated in response to the first mat selection signal XMATYF1 activated to a "high" level. The current path may not be formed between the first storage unit 410 and the first driving control unit 420 since the first data line DL1 is fixed to the "low" level. The fourth NMOS transistor MN4_1 of the first output unit 4300 connected to the third storage node SN3 may be activated in response to the "high" level of the third storage node SN3 when the "high, low, high, and low" levels are respectively latched in the first to fourth storage nodes SN1 to SN4 of the first storage unit 410. Accordingly, the first output unit 4300 may output a "low" level from the output node OUT to outside since a current path is formed between the fourth NMOS transistor MN4_1 and the fifth NMOS transistor MN5_1 and the output node OUT.

In contrast, the third NMOS transistor MN3_2 of the second driving control unit 450 and the fifth NMOS transistor MN5_2 of the second output unit 4400 may be activated in response to the second mat selection signal XMATYF2 activated to a "high" level. The current path may not be formed between the second storage unit 440 and the second driving control unit 450 since the third data line DL3 is fixed to the "low" level. The fourth NMOS transistor MN4_2 of the second output unit 4400 to which the third storage node SN3 is connected is deactivated in response to the "low" level of the third storage node SN3 when the "low, high, low, and high" levels are respectively latched in the first to fourth storage nodes SN1 to SN4 of the second storage unit 440. Accordingly, the second output unit 4400 may output the floating value since the fourth transistor MN4_2 is deactivated although the fifth NMOS transistor MN5_2 is activated. That is, the output node OUT may maintain the "high" level that has been initially set.

<An Example in which the Activation Section of the First Mat Selection Signal XMATYF1 Overlaps with that of the Second Mat Selection Signal XMATYF2 During the Normal Operation>

In a semiconductor memory device, when a time interval tRP for which active and precharge commands are received is shortened, the second mat selection signal XMATYF2 may be activated when the first mat selection signal XMATYF1 has not been reset. When the activation section of the first mat selection signal XMATYF1 overlaps with that of the second mat selection signal XMATYF2, the first and second latch units 4100 and 4200 may not form the current path between the first storage unit 410 and the first driving control unit 420 and the current path between the second storage unit 440 and the second driving control unit 450, respectively, in response to the third data line DL3 fixed to the "low" level. Accordingly, the first and second latch units 4100 and 4200 may normally maintain latched data when the boot-up operation is performed since the latched data are not changed although the activation sections of the first and second mat selection signals XMATYF1 and XMATYF2 overlap with each other during the normal operation.

For example, the locations and types of the logic gates and transistors illustrated in the aforementioned embodiments may be implemented differently depending on the polarity of the input signals.

The redundancy circuit of the semiconductor memory device according to the proposed embodiments may control data latched during a boot-up operation so that it is not changed during a normal operation by blocking a current path from being formed between a data line and a latch unit for storing information on whether fuse data has been programmed, during the normal operation.

Although various embodiments have been described for illustrative purposes, it will be apparent to those skilled in the art that various changes and modifications may be made without departing from the spirit and scope of the invention as defined in the following claims.

What is claimed is:

1. A fuse circuit comprising:
   a storage unit capable of storing defective address information corresponding to mat information when a boot-up operation is performed;
   a driving control unit coupled between the storage unit and a first power source terminal, capable of forming a current path between the storage unit and the first power source terminal in response to the defective address information transferred through a first data line and the mat information transferred through a second data line while blocking the current path between the storage unit and the first power source terminal when a normal operation is performed; and
   an output unit capable of outputting the defective address information stored in the storage unit when the normal operation is performed.

2. The fuse circuit of claim 1, wherein the storage unit comprises:
   first to fourth storage nodes; and
   first to fourth transistor pairs, each comprising a PMOS transistor and an NMOS transistor coupled in series through a corresponding one of the first to fourth storage nodes.

3. The fuse circuit of claim 2, wherein each of the first to fourth storage nodes is coupled to a gate of an NMOS transistor of a transistor pair in a previous stage and a gate of a PMOS transistor of a transistor pair in a next stage.

4. The fuse circuit of claim 2, wherein the driving control unit comprises:
   first and second input transistors coupled to the second and fourth storage nodes, respectively, and driven in response to the defective address information; and
   a third input transistor coupled between the first and second input transistors and the first power source terminal, and driven in response to the mat information.

5. The fuse circuit of claim 2, wherein the output unit comprises:
   a first output transistor driven in response to a voltage level of the third storage node when the normal operation is performed; and
   a second output transistor driven in response to the mat information when the normal operation is performed.

6. The fuse circuit of claim 1, wherein the storage unit comprises a cross-coupled latch.

7. The fuse circuit of claim 1, wherein the first power source comprises a ground power source.

8. A redundancy circuit of a semiconductor memory device, comprising:
   a fuse array capable of sequentially outputting defective address information through a first data line when a boot-up operation is performed;
   a repair address output unit capable of storing the defective address information received through the first data line when the boot-up operation is performed, and outputting the defective address information to an output line that is different from the first data line, in response to mat information when a normal operation is performed; and
   an address comparison unit capable of comparing the defective address information output through the output line with a normal address and generating a redundancy activation signal.

9. The redundancy circuit of claim 8, wherein the repair address output unit comprises:
   a latch unit capable of latching the defective address information corresponding to the mat information; and
   an output unit capable of outputting the defective address information latched in the latch unit when the normal operation is performed.

10. The redundancy circuit of claim 9, wherein the latch unit comprises:
    a storage unit capable of storing the defective address information corresponding to the mat information when the boot-up operation is performed; and
    a driving control unit coupled between the storage unit and a first power source terminal, and capable of forming a current path between the storage unit and the first power source terminal in response to the defective address information transferred through the first data line and the mat information transferred through a second data line while blocking the current path between the storage unit and the first power source terminal when the normal operation is performed.

11. The redundancy circuit of claim 10, wherein the storage unit comprises a cross-coupled latch.

12. The redundancy circuit of claim 10, wherein the storage unit comprises:
    first to fourth storage nodes; and
    first to fourth transistor pairs, each comprising a PMOS transistor and an NMOS transistor coupled in series through a corresponding one of the first to fourth storage nodes.

13. The redundancy circuit of claim 12, wherein each of the first to fourth storage nodes is coupled to a gate of an NMOS transistor of a transistor pair in a previous stage and a gate of a PMOS transistor of a transistor pair in a next stage.

14. The redundancy circuit of claim 10, wherein the driving control unit comprises:
    first and second input transistors coupled to the second and fourth storage nodes, respectively, and driven in response to the defective address information; and
    a third input transistor coupled between the first and second input transistors and the first power source terminal, and driven in response to the mat information.

15. The redundancy circuit of claim 10, wherein the first power source comprises a ground power source.

16. The redundancy circuit of claim 9, wherein the output unit comprises:
    a first output transistor driven in response to a voltage level of the third storage node when the normal operation is performed; and
    a second output transistor driven in response to the mat information when the normal operation is performed.

17. The redundancy circuit of claim 16, wherein the first and second output transistors are coupled between the output line and the first power source terminal.

* * * * *